United States Patent [19]

Miller et al.

[11] Patent Number: 4,667,487
[45] Date of Patent: May 26, 1987

[54] REFRIGERATED PENETRATION INSERT FOR CRYOSTAT WITH ROTATING THERMAL DISCONNECT

[75] Inventors: Russell S. Miller; Steven J. Brzozowski, both of Scotia, N.Y.

[73] Assignee: General Electric Company, Schenectady, N.Y.

[21] Appl. No.: 859,583

[22] Filed: May 5, 1986

[51] Int. Cl.⁴ .............................................. F25B 19/00
[52] U.S. Cl. ..................................... 62/514 R; 62/45; 62/298; 285/47; 285/904
[58] Field of Search ..................... 62/45, 298, 514 R; 285/47, DIG. 5

[56] References Cited

U.S. PATENT DOCUMENTS

| | | | |
|---|---|---|---|
| 3,066,222 | 11/1962 | Poorman et al. | 62/514 R |
| 3,309,884 | 3/1967 | Paulinkonis | 62/45 |
| 3,377,813 | 4/1968 | Mordhorst | 62/45 |
| 3,399,691 | 9/1968 | Schoch et al. | 62/55 |
| 3,483,709 | 12/1969 | Baicher et al. | 62/514 R |
| 3,714,942 | 2/1973 | Fischel et al. | 62/45 |
| 3,894,403 | 7/1975 | Longsworth | 62/55 |
| 4,279,127 | 7/1981 | Longsworth | 62/514 R |
| 4,384,222 | 5/1983 | Zerlik | 62/505 |
| 4,516,404 | 5/1985 | Laskaris | 62/514 R |
| 4,522,034 | 6/1985 | Laskaris | 62/514 R |
| 4,526,015 | 7/1985 | Laskaris | 62/514 R |
| 4,535,596 | 8/1985 | Laskaris | 62/514 R |
| 4,562,703 | 1/1986 | Miller et al. | 62/514 R |

Primary Examiner—Ronald C. Capossela
Attorney, Agent, or Firm—William H. Steinberg; James C. Davis, Jr.; Paul R. Webb, II

[57] ABSTRACT

A rotating refrigerator connection is provided which allows field interruption of the heat conduction path between a one, two or three stage cryogenic refrigerator and a cryostat in the event of a refrigerator failure or scheduled service.

6 Claims, 12 Drawing Figures

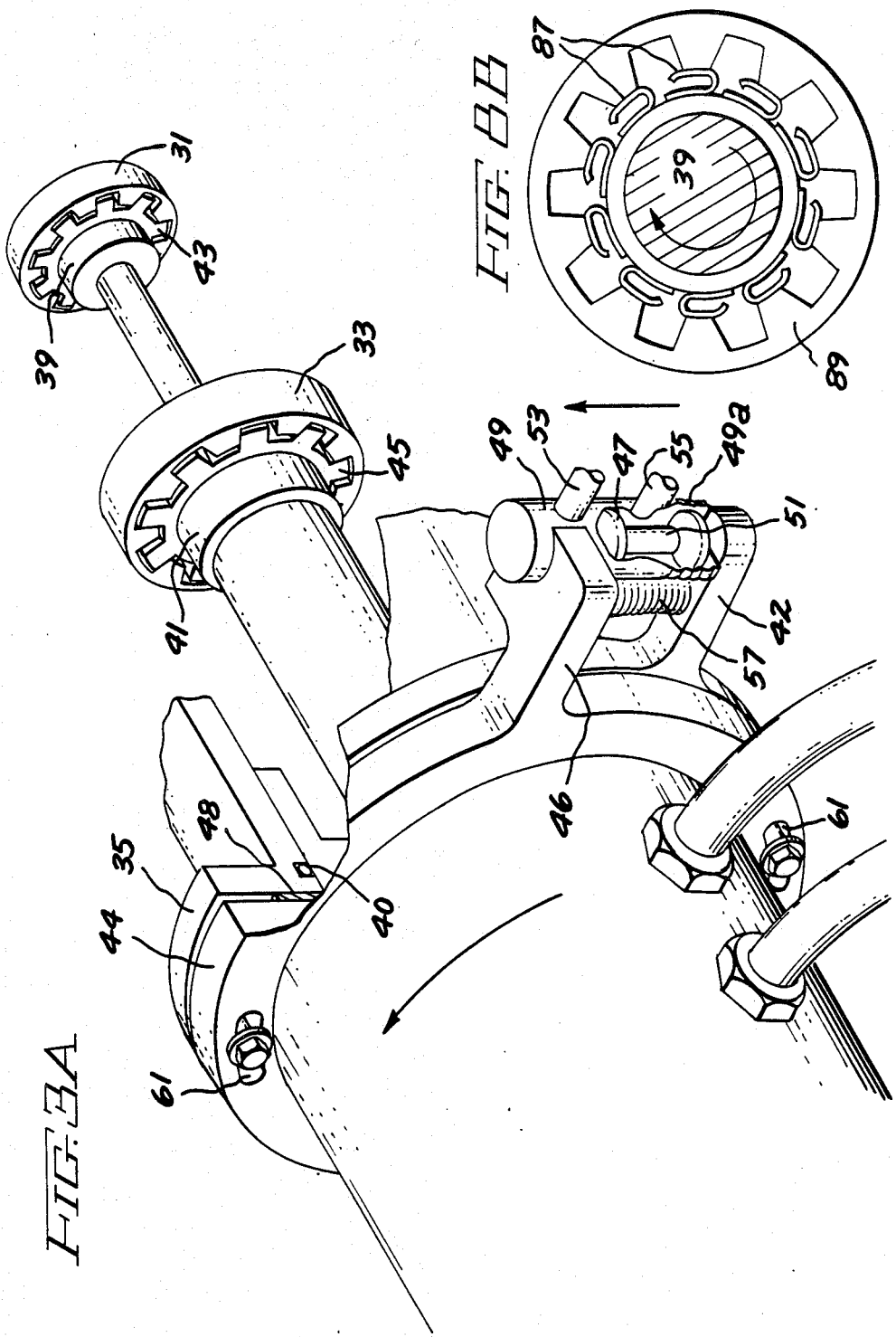

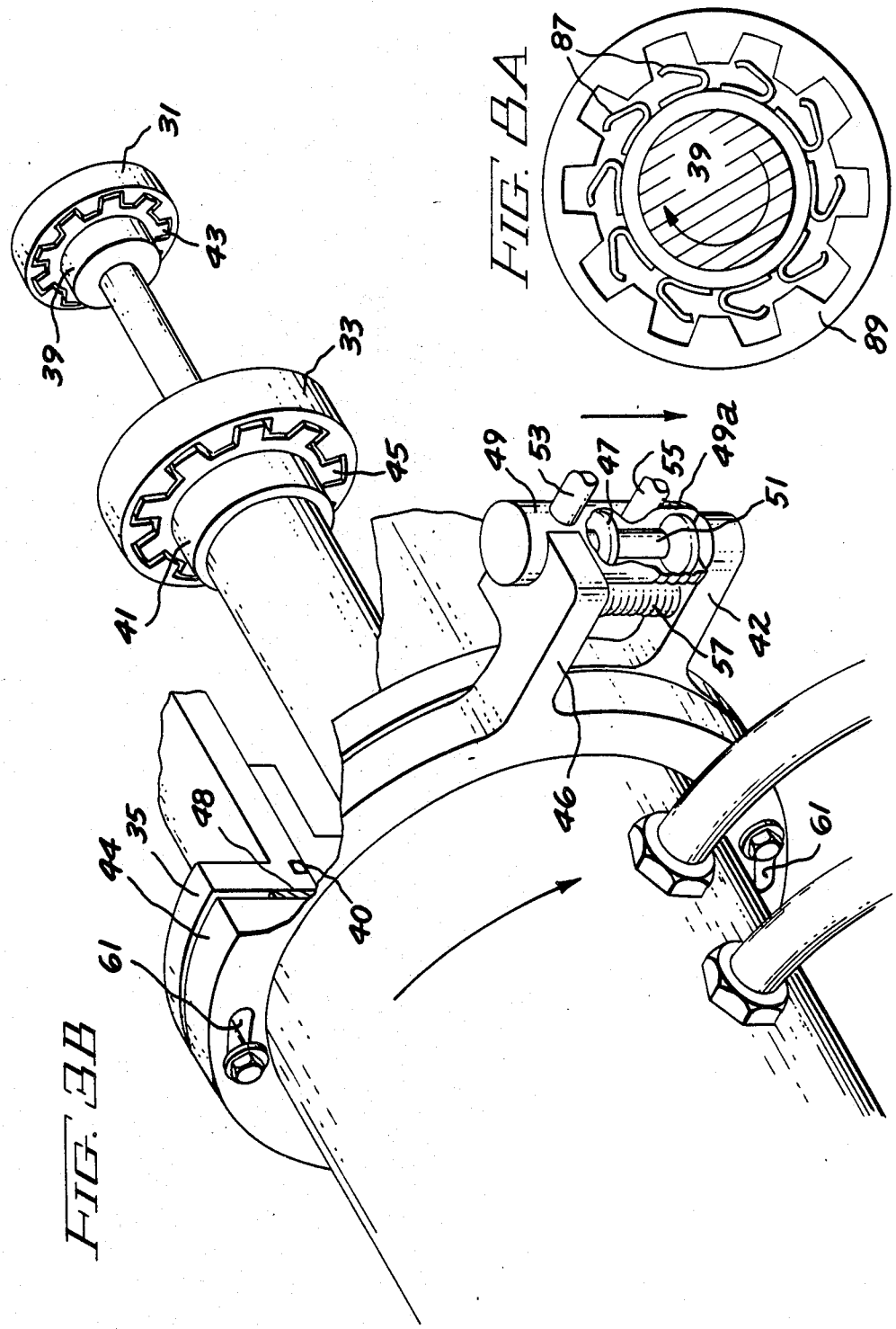

REFRIGERATED PENETRATION INSERT FOR CRYOSTAT WITH ROTATING THERMAL DISCONNECT

CROSS REFERENCE TO RELATED APPLICATIONS

The present invention is related to copending applications Ser. No. 826,058 filed on Feb. 2, 1986 entitled "A Horizontal Cryostat Penetration With a Vertical Service Stack" and application Ser. No. 859,582 filed May 5, 1986 entitled "Refrigerated Penetration Insert For Cryostat With Axial Thermal Disconnect" both hereby incorporated by reference.

BACKGROUND OF THE INVENTION

The present invention relates to cryostat penetration plugs having a field interruptible cryogenic refrigerator interface.

In the generation of medical diagnostic images in magnetic resonance (MR) imaging, it is necessary to provide a temporally stable and spacially homogeneous magnetic field. The use of superconductive electrical materials maintained at a temperature below their critical transition temperatures, provides an advantageous means to produce such a field. Accordingly, for such MR imaging devices, a cryostat is employed. A cryostat contains an innermost chamber in which liquid helium, for example, is used to cool the superconductor materials. The cryostat itself, typically comprises a generally toroidal structure with other nested toroidal structures inside the exterior vessel, to provide the desired vacuum conditions and thermal shielding. Since it is necessary to provide electrical energy to the main magnet coil and to various collection coils employed in MR imaging and to replenish coolant material it is necessary that there be at least one penetration through the cryostat walls.

During magnet operation, superconductive temperatures are maintained by helium evaporation as well as by nitrogen evaporation from a nitrogen vessel surrounding and shielding the inner helium vessel. To reduce the expense of replacing cryogenic fluids, a cryogenic refrigerator can be coupled to the cryostat to remove heat from the cryostat radiation shields and thereby reduce cryogen fluid evaporation. Refrigeration can lower the temperature of the intermediate radiation shield surrounding the helium vessel. Radiation heating between the intermediate shield and the helium vessel varies as the fourth power of the shield temperature so reducing the shield temperature by one half would result in a sixteen fold reduction in radiation transfer.

Several methods of interfacing cryogenic refrigerators to cryostats have been proposed. Most of these address the need for good thermal contact while maintaining a reasonable ability to remove and/or service the refrigerator. U.S. Pat. No. 4,279,127 describes a refrigerator using a vertical orientation which allows helium gas stratification if the refrigerator fails or is removed for service. The current invention is directed towards an application requiring a substantially horizontal orientation which prohibits the use of a gas space which would develop convection cells.

It is an object of the present invention to provide an interface for a horizontal cryostat penetration insert for a magnetic resonance magnet, coupling a 1, 2 or 3 stage cryogenic refrigerator to the penetration insert.

It is a further object of the present invention to provide an automatic thermal disconnect to interrupt the refrigerator-cryostat conduction path in the event of a refrigerator failure.

SUMMARY OF THE INVENTION

In one aspect of the present invention an interface for a horizontal cryostat penetration insert for coupling a cryogenic refrigerator cold end to the horizontal cryostat penetration insert is provided. The insert comprises an outer housing, an inner supercooled envelope and radiation shield. The cryogenic refrigerator cold end has a recondenser stage. The interface comprises an extension of the outer housing permitting access to the interior of the housing. An extension of the radiation shield into the housing extension is also provided. A first thermal contact defines a central aperture and is affixed to the end of the shield extension to provide heat conduction between the shield extension the first thermal contact. A second thermal contact is affixed to the end of the stage of the refrigerator cold end to provide good heat conduction between the second thermal contact and the cryogenic refrigerator stage. Means for rotatably mounting the stage of the cold end refrigerator in the housing extension, positions the second thermal contact in the aperture of the first thermal contact. Means for rotating the refrigerator cold end brings the first and second thermal contacts into and out of contact with one another.

BRIEF DESCRIPTION OF THE DRAWING

While the specification concludes with claims particularly pointing out and distinctly claiming the present invention, objects and advantages of the invention can be more readily ascertained from the following description of preferred embodiments when used in conjunction with the accompanying drawing in which

FIG. 3A and B are cutaway isometric views of the cryogenic refrigerator situated in the interface in the contact and open positions, respectively;

FIG. 8A and 8B are front views of another embodiment of a thermal contact in the open and closed positions, respectively, in accordance with the present invention.

DETAILED DESCRIPTION OF THE INVENTION

Figure 1:
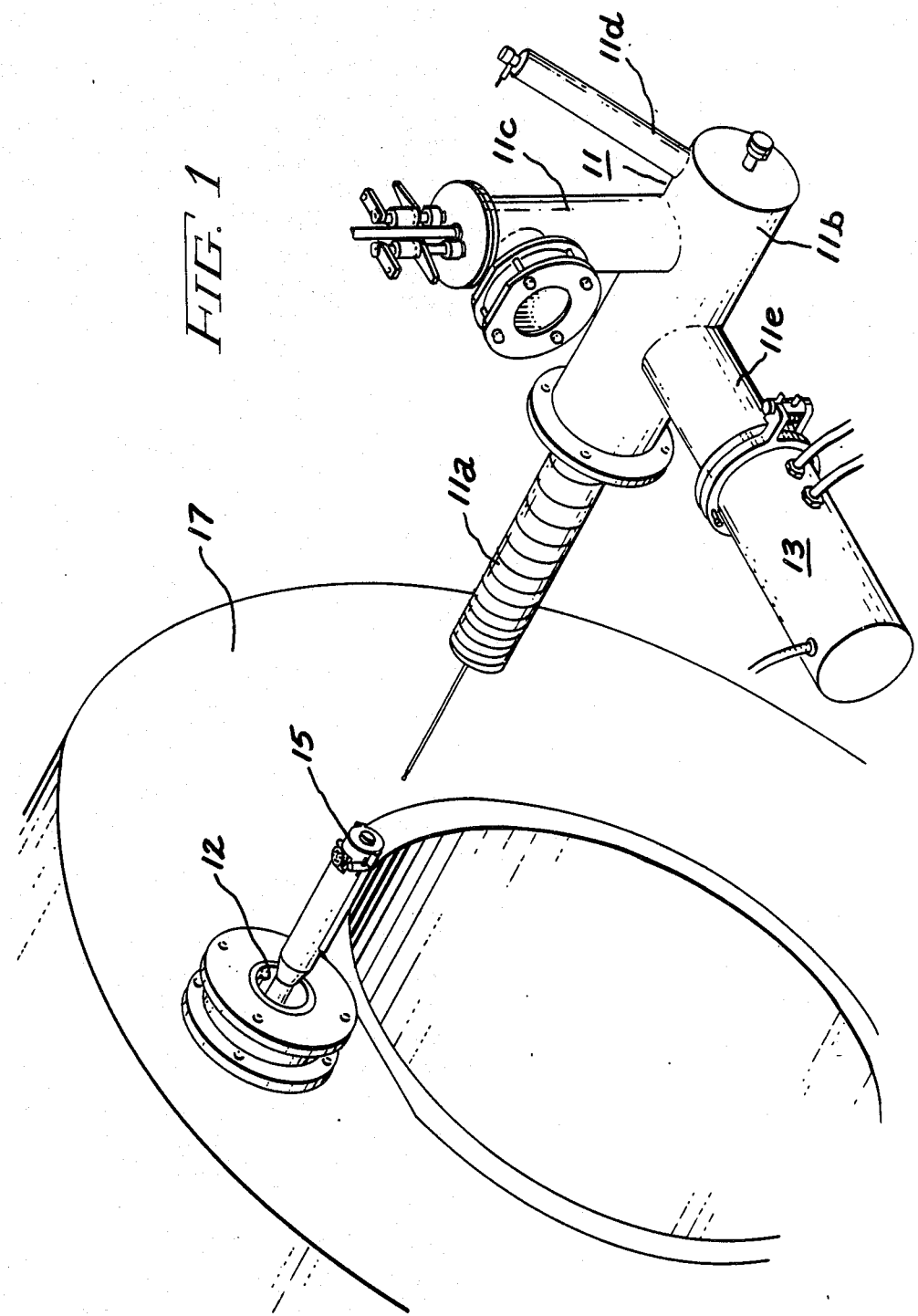
FIG. 1 is an exploded isometric view of a cryostat and a cryostat insert penetration with a cryogenic refrigerator interface in accordance with the present invention.

Referring now to the drawing wherein like reference numerals indicate like elements throughout and more particularly to FIG. 1 thereof. A vacuum jacketed insert 11 of the type described and claimed in application Serial No. 826,058 filed on Feb. 2, 1986 entitled "A Horizontal Cryostat Penetration With a Vertical Service Stack" is shown, modified to accept a cryostat refrigerator cold end 13.

The insert 11 has a first horizontal portion 11a which extends into a cryostat penetration and a second horizontal portion 11b having an ambient temperature shell. A vertical service stack 11c extends vertically from the second horizontal portion providing access to electrical leads 15 extending from a cryostat penetration 12 in cryostat 17. A slant fill tube 11d extends from the second horizontal portion and is used for adding liquid helium to the cryostat. An interface 11e for connecting a two stage cryogenic refrigerator cold end to the cryostat is also shown extending from the second horizontal portion 11b.

Figure 2:
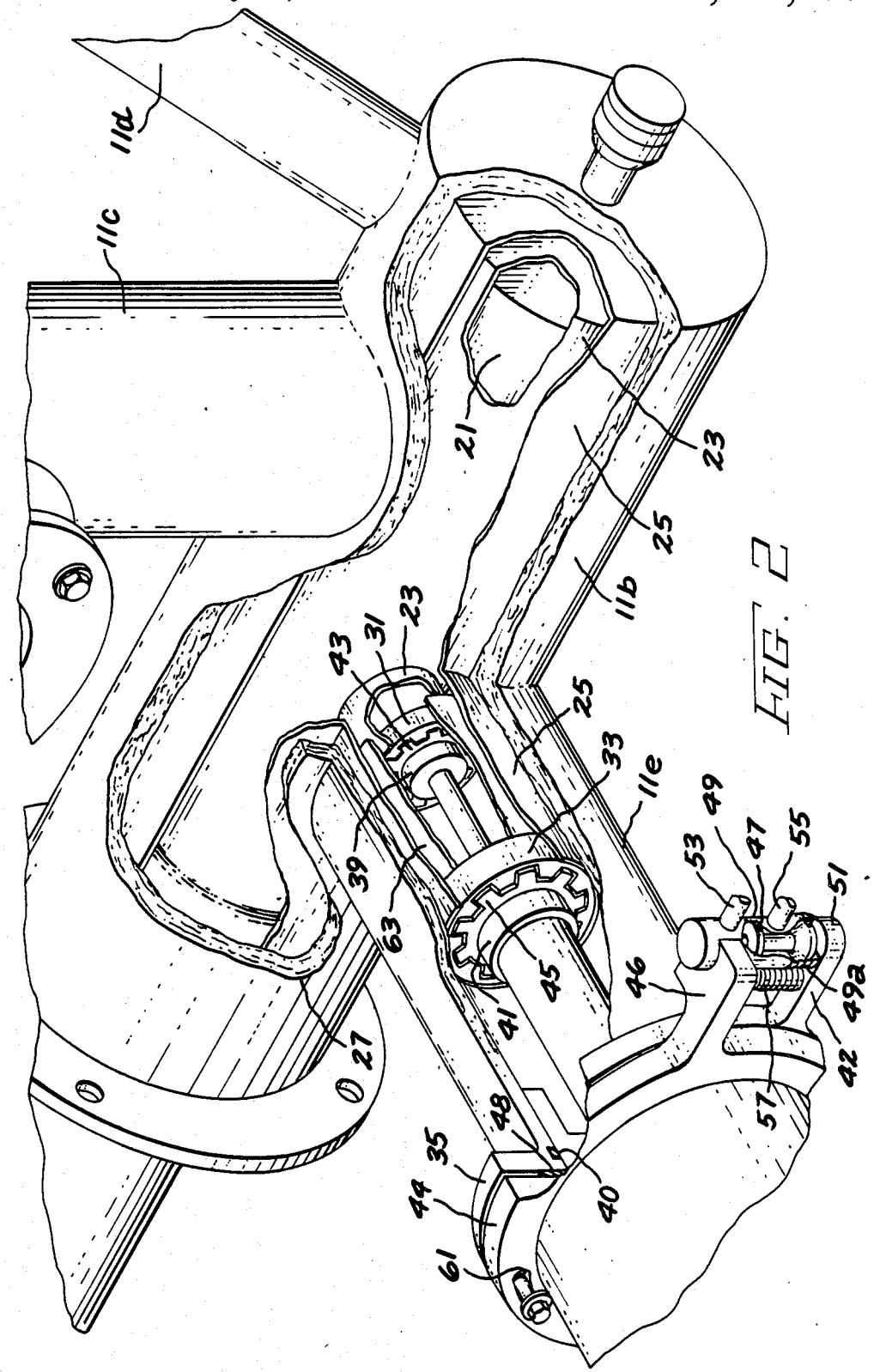
FIG. 2 is a partially cutaway isometric view of a portion of the horizontal cryostat insert together with the interface in accordance with the present invention.

Referring now to FIG. 2 the insert 11 has an inner 4.2° K. envelope 21 which is in flow communication with the interior of the helium vessel, located in the cryostat 17, when the first horizontal portion 11a of the insert is situated in the cryostat penetration 16. Inner and outer radiation shields 23 and 25, respectively, are situated in the insert 11. The inner radiation shield 23 surrounds the 4.2° K. envelope 21 and the outer radiation shield 25 surrounds the inner radiation shield 23. When the insert is situated in the cryostat 17 and a superconducting magnet situated in the cryostat is operating in the persistent mode, the inner and outer shields are heat stationed to an intermediate and an outer shield (both not shown) located in the cryostat 17.

The interface 11e comprises a generally cylindrical extension of the ambient temperature shell 27 which can be fabricated of nonmagnetic material such as stainless steel and extends perpendicularly from the second horizontal portion 11b of the insert. The inner and outer shields 23 and 25, respectively, extend from the second horizontal portion 11b of the insert as concentric cylinders with each of the concentric cylinders terminating in a coupling 31 and 33, respectively. The inner shield 23, which is also the inner concentric cylinder, is the colder of the two shields during magnet operation. Although the inner shield extends to form a cylinder, the inner shield continues to surround the 4.2° K. envelope at the base of the extending cylinder. The inner concentric cylinder extends through an opening in the outer shield 25. The outer concentric cylinder extends from the perimeter of the opening through which the inner concentric cylinder extends. The inner concentric cylinder extends part way into the ambient temperature shell of the interface and terminates in coupling 31. The outer concentric cylinder extends further into the interface and terminates in coupling 33.

The couplings 31 and 33 each comprise rings of heat conductive material such as copper. The outer diameter of the rings equals the inner diameter of the concentric cylinder shield extensions. The outside surface of the rings is secured to the concentric cylinders such as by soldering. The inside diameters of the rings have a plurality of circumferentially spaced apart, radially inwardly extending, generally rectangular projections, having the appearance of an internal gear. An internal gear is an annular gear with teeth on the inner surface of the rim. The ambient temperature shell of the interface terminates in a flange 35. A two stage closed cycle refrigerator, commercially available from manufacturers such as Air Products, Allentown, PA and CTI, Waltham, MA, comprises a compressor (not shown) for providing pressurized helium gas and a cold end. The cold end 13 comprises a valve motor and two expander engines located in cylindrical housing terminating in a first and second stage having copper ring heat stations 39 and 41, respectively. Ring shaped couplings 43 and 45 of heat conductive material such as copper may be integral to the heat stations or as shown in the present embodiment soldered to the ends of the heat stations 39 and 41, respectively. The outside diameter of the rings 43 and 45 each have a plurality of circumferentially spaced apart radially outwardly extending generally rectangular projections having the appearance of a gear. The couplings 31 and 33 at the end of the cylindrical extensions of the shields are longitudinally spaced apart the same distance as the ring shaped couplings 43 and 45. The couplings 43 and 45 fit inside the couplings 31 and 33, respectively, with the projections interdigitated without making contact. A flange 44 on the cylindrical housing of the cold end of the refrigerator is rotatably mounted on flange 35 at the end of the interface 11e. A dynamic "O" ring 40 is used to join the interface to the refrigerator. The "O" ring 40 is situated in a circumferential groove in the inside of the generally cylindrical extension 11e at the end near flange 35. The refrigerator has cylindrical bushing portion extending inside the cylindrical extension fitting snugly to maintain the vacuum inside the insert extension inside the "O" ring. A disc of fluorocarbon bearing material 48 is situated between the two flanges is to provide a sliding bearing surface since the parts must rotate relative to each other.

Each of the flanges 35 and 44 has an outwardly extending arm 42 and 46, respectively, spaced apart from one another and situated approximately parallel to one another. Affixed to arm 46 and situated between the two arms 42 and 46 is a hermetically sealed piston 47. The piston is slideably situated in a cylindrical housing 49 having a flexible cylindrical bellows portion 49a adjacent arm 42. The piston 47 has a plunger 51 extending from the piston towards bellows end of the housing. A high pressure port 53 is in flow communication with the inside portion of the hermetically sealed housing on one side of the piston 47 and a low pressure port 55 is in flow communication with the housing on the other side of the plunger where the flexible bellows is located forming a double-acting hydraulic actuator. An opening spring 57 is secured between the two arms 42 and 46 so that it can exert a closing force pulling the two outwardly extending arms towards one another when the spring 57 is put under tension. The high pressure port 53 is coupled to the output of the refrigerator compressor and the low pressure port 55 is coupled to the return line of the compressor.

In operation the compressor (not shown) supplies helium gas under pressure to the cold end 13 which cools the first and second stage heat exchangers to approximately 20° K. and 50–60° K., respectively. When the compressor is operating, the pressure difference between the helium gas pressure supplied to the cold end and the pressure of the gas returned is used to rotate the cold end to force the contacts 45 and 33, and 43 and 31 against one another. Metal to metal thermal contact improves with increasing normal forces, however, if these forces were achieved with direct axial insertion of the cold end portion of the refrigerator, significant torques would be exerted about the insert radiation shell termination points. These torques could deform the thin radiation shields or result in direct contact between adjacent shields producing thermal shorts. In the present invention the rotation and therefore the resulting torques are in a plane perpendicular to the plane in which torque resulting from pure axial insertion lies. Torque on the insert terminations will be reduced, but not eliminated. The rotation resulting from the pressure difference is accomplished be means of the hermetically sealed valve comprising piston 47, plunger 51 and housing 49. The pressure difference across the cold end when supplied to the two ports 53 and 55 on the housing 49 forces the plunger 51 to move away from the high pressure port 53 resulting in movement of the plunger against the end of the housing adjacent arm 43 causing the bellows to elongate and the arms to be pushed apart stretching the closing spring 57. The surfaces of the radial projections of the couplings are forced against one another when rotated about the longitudinal axis of the shield extensions, achieving high normal forces at the contacts, resulting in good thermal transfer from the radiation shields 23 and 25 to the first and second stages 39 and 41, respectively, of the cold end. The good thermal transfer is achieved without transmitting large forces to the radiation shields.

The most probable type of failure of two or three stage cryogenic refrigerators involves compressor stoppage due to the loss of helium, loss of compressor cooling, motor failure, or power outage. FIG. 3A shows the contacts 33 and 45, and contacts 31 and 43 in the closed position, which occurs when a higher pressure is supplied to high pressure port 53 than low pressure port 55. A fully automatic disconnect of the refrigerator cryostat conduction path to prevent excessive heat leak to the cryostat results when the pressure difference across the cold end is reduced. FIG. 3B shows the opening spring 57 tension having rotated the cold end (in the direction shown by the arrow) so that there is no longer contact between the contacts 33 and 45, and 31 and 43. Slots 61 in flange 41 can be used to control the amount of rotation to assure the couplings do not rotate too far, and again form a conduction path. The thermal disconnect between the refrigerator and the cryostat can be achieved at any other time when desired, such as for servicing, by shutting down the compressor. It is not necessary to break the vacuum within the insert in order to service the refrigerator.

The continuation of the inner radiation shield 23 across the base of the cylindrical extension of the shield, assures that the inner 4.2° K. envelope 21 will not be directly exposed to radiation from the end of the first stage When the refrigerator is not operating. A radiation shield 63 coupled to contact 33 surrounds the second stage of the refrigerator to minimize radiation to the inner shield 23 when the refrigerator is not operating.

Figure 4A:
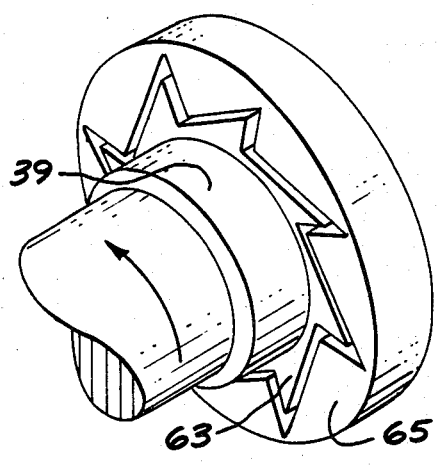
FIGS. 4A and 4B are isometric views of another embodiment of a thermal contact in the open and closed positions, respectively, which can be used in the interface in accordance with the present invention.
Figure 4B:
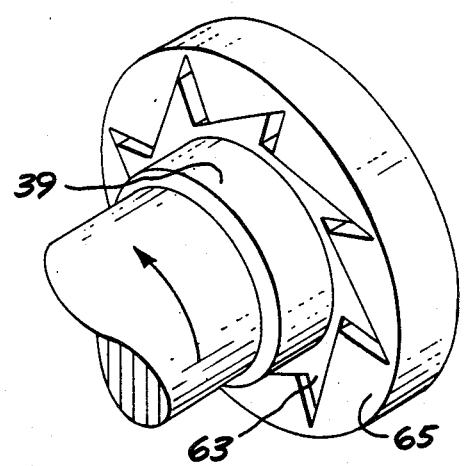

Contacts which engage by means of rotation along about the longitudinal axis of the shield extension can have different geometries. Several possible geometries are shown in FIGS. 4A, 4B, 5A, 5B, 6, 7, 8A and 8B for the contacts between the cold stations of the refrigerator and the insert shields. Referring now to FIGS. 4A and 4B, an inner contact 63 having a plurality of outwardly extending saw tooth projections is soldered to a heat station 39 of a stage of the refrigerator cold end. The inner contact 63 is situated in an outer contact 65 having a generally circular aperture with saw tooth projections circumferentially space about the aperture. Rotating the inner contact in the direction shown by an arrow in FIGS. 4A and 4B brings one face of each of the inclined saw tooth projections in contact 63 against a corresponding face of a saw tooth projection in the aperture in the outer contact 65.

Figure 5A:
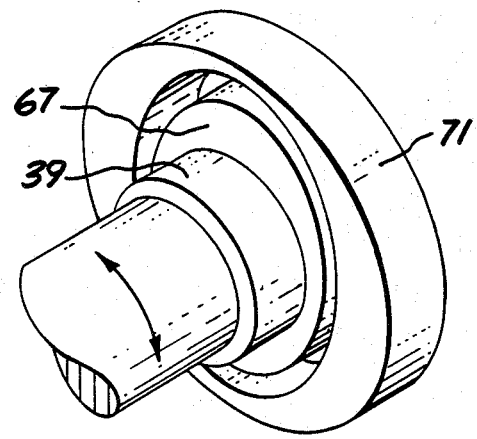
FIGS. 5A and 5B are isometric views of another embodiment of a thermal contact in the open and closed positions, respectively, which can be used in the interface in accordance with the present invention.
Figure 5B:
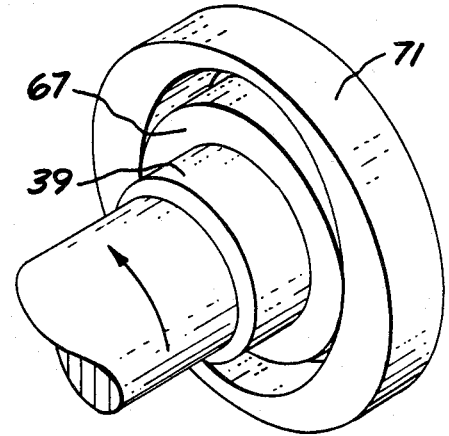

Referring now to FIGS. 5A and 5B an elliptically shaped inner contact 67 is shown soldered to a heat station 39 and situated in an outer contact 71 having an elliptical shaped aperture. Rotation of the inner contact in either direction results in thermal contact between a portion of the outer circumference of the inner contact with a portion of the inner surface of the outer contact.

Figure 6:
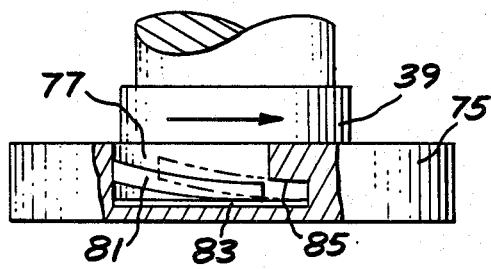
FIG. 6 is a partially cutaway side view of another embodiment of a thermal contact in the open position which can be used in the interface in accordance with the present invention.
Figure 7:
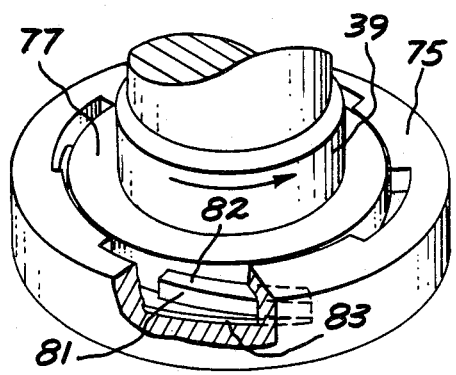
FIG. 7 is a partially cutaway isometric view of the thermal contact of FIG. 6 in the closed position.

Referring now to FIGS. 6 and 7 the outer contact 75 of heat conductive material, such as copper, which would be mounted on the end of the radiation shield extension, such as by soldering, is shown with an inner contact 77 situated inside the outer contact, but in the open position. The inner contact 67 is generally cylindrical, and is coaxial with the cylindrical heat station 39. The inner contact is fabricated of heat conductive material, such as copper and is mounted on the heat station 39 such as by soldering. Four projections 81 extend partially circumferentially around the inner contact, each having a surface 82 extending perpendicularly from the cylinder surface. One circumferential end of each projection 81 is displaced longitudinally from the other end of the same projection. When the inner contact is slid into the outer contact, the projections 81 each fit into an aperture defined in the outer contact. A portion of the projections contact insulating material 83 mounted on the outer contact and no other portion of the outer contact creating the open position. The inner contact is rotated in the direction shown by the arrow in FIG. 6 without any axial displacement and the projections 81 enter tunnel apertures 85 in the outer contact, wherein the inclined surface 82 makes contact with a surface in the tunnel aperture 75 having a similar incline creating a conduction path between the contacts.

Referring now to FIGS. 8A and 8B the cylindrical heat station 39 has a plurality of thermal spring contacts 87 arranged circumferentially around the heat station. Each spring contact comprises a U-shaped spring with one side of the U-shaped spring joined to the heat station, such as by soldering. The springs preferably comprise a material such as by soldering. The springs preferably comprise a material such as berylium copper or phosphor bronze. The outer contact 89 comprises ring of thermally conductive metal such as copper. The inside diameter of the ring has a plurality of spaced apart, radially walls extending, generally rectangular projections, housing the appearance of an internal gear. The spring contacts are arranged so that rotation of the heat station causes the springs to deflect upon insertion under the projections to provide normal contact force between the thermal spring contact and the inner portion of the projections. FIG. 8A shows the contacts situated between the projections in the open position. When the rotation shown by the direction of the arrows occurs, the springs deflect upon insertion under the outer contact projections, as shown in FIG. 8B, providing normal contact force between the thermal spring contacts and inner face of projections. Suitable spring contacts are shown in U.S. Pat. No. 4,562,703 filed Nov.

29, 1984, and assigned to the instant assignee. U.S. Pat. No. 4,562,703 is hereby incorporated by reference.

Since two or three thermal couplings may be needed on the same axial center line depending on how many stages the refrigerator has and since it is desirable that good engagement of all contacts is made simultaneously, one of the contact surfaces can be covered with a crushable metal felt or soft metal such as indium.

The foregoing describes an interface for a horizontal cryostat penetration insert of a magnetic resonance magnet for coupling a 1, 2 or 3 stage cryogenic refrigerator to the penetration insert. An automatic thermal disconnect to interrupt the refrigerator-cryostat conduction path in the event of a refrigerator failure has also been described.

While the invention has been particularly shown and described with reference to several embodiments thereof, it will be understood by those skilled in the art that various changes in form and detail may be made without departing from the spirit and scope of the invention.

What is claimed is:

1. An interface for a horizontal cryostat penetration insert for coupling a cryogenic refrigerator cold end to the cryostat penetration insert, said insert having an outer housing and a thermal radiation shield, said cryogenic refrigerator cold end having at least one stage, said interface comprising:
   an extension of said outer housing providing access to the interior of said housing;
   an extension of said thermal radiation shield into said housing extension;
   a first thermal contact means affixed to the end of said thermal radiation shield extension, said first thermal contact means defining a central aperture and providing heat conduction between said shield extension and said first contact;
   a second thermal contact affixed to the stage of the cryogenic refrigerator cold end to provide heat conduction from the second thermal contact means to the cryogenic refrigerator stage;
   means for rotatably mounting the stage of cold end refrigerator in the housing extension, said second thermal contact means situated in the central aperture defined by said first thermal contact means; and
   means for rotating the cold end refrigerator to bring said first and second thermal contact means into and out of contact with one another.

2. The apparatus of claim 1 wherein said means for rotating comprising a hydraulic double-acting cylinder actuator having two ports for receiving the compressed gas supplied to the refrigerator cold end and the return gas, respectively, the pressure differential and lack of differential capable of rotating said cold end to bring said first and second thermal contact means into and out of contact, respectively.

3. The apparatus of claim 1, wherein said first thermal contact means comprising an internal gear of heat conducting material having a plurality of teeth and said second thermal contact means comprising gear having a plurality of radially outwardly extending teeth, said second contact means capable of being situated inside said first contact means without creating a heat conduction path between the two contact means and forming a heat conduction path between the two contact means with the relative rotation of the first and second thermal contact means.

4. The apparatus of claim 1, wherein said first thermal contact; means comprises a disk of heat conductive material having an elliptic central aperture and said second thermal contact means comprising a disk having an elliptical shape, said second contact means capable of being situated inside said first contact means without creating a heat conduction path and forming a heat conductive path between the two contact means with the relative relation of the first and second thermal contact means.

5. The apparatus of claim 1, wherein said first thermal contact means comprises a disk of heat conductive material having circular central aperture and said second thermal contact means comprising a disk of conductive material having a plurality of radially outwardly extending projections extending partially circumferentially about the outside perimeter of the disk, one circumferential end of each of the projections being displaced in the longitudinal direction from the other end of the same projection, the second thermal contact means capable of being situated in the first thermal contact means without creating a heat conduction path between the two contact means and forming a heat conduction path between the two contact means when said second contact means is rotated relative to the first contact means and said projections make contact with said first contact means.

6. An interface with an automatic disconnect for a horizontal cryostat penetration insert for coupling a cryogenic refrigerator cold end to the cryostat penetration insert, said insert having an outer housing and a thermal radiation shield, said cryogenic refrigerator cold end having at least one stage, said interface comprising:
   an extension of said outer housing providing access to the interior of said housing;
   an extension of said thermal radiation shield into said housing extension;
   a first thermal contact means affixed to the end of said thermal radiation shield extension, providing heat conduction between said shield extension and said first contact;
   a second thermal contact affixed to the stage of the cryogenic refrigerator cold end to provide heat conduction from the second thermal contact means to the cryogenic refrigerator stage;
   means for mounting the stage of cold end refrigerator in the housing extension, said second thermal contact means situated in thermal contact with said first thermal contact means; and
   means for moving the cold end refrigerator to bring said first and second thermal contact means into and out of contact with one another said means comprising a hydraulic double-acting cylinder actuator having two ports for receiving the compressed gas supplied to the refrigerator cold end and the return gas, respectively, the pressure differential and lack of differential capable of moving said cold end to bring said first and second thermal contact means into and out of contact, respectively.

* * * * *